(12) United States Patent
Götz et al.

(10) Patent No.: US 10,345,342 B2
(45) Date of Patent: Jul. 9, 2019

(54) ROGOWSKI CURRENT WITH ACTIVE CAPACITANCE COMPENSATION

(71) Applicant: Dr. Ing. h.c. F. Porsche Aktiengesellschaft, Stuttgart (DE)

(72) Inventors: Stefan Götz, Forstern (DE); Hermann Dibos, Remchingen (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 21 days.

(21) Appl. No.: 15/837,437

(22) Filed: Dec. 11, 2017

(65) Prior Publication Data

US 2018/0164346 A1    Jun. 14, 2018

(30) Foreign Application Priority Data

Dec. 13, 2016    (DE) .................. 10 2016 124 167

(51) Int. Cl.
| | |
|---|---|
| *G01R 15/18* | (2006.01) |
| *G01R 15/24* | (2006.01) |
| *G01R 19/25* | (2006.01) |
| *H01F 38/30* | (2006.01) |

(52) U.S. Cl.
CPC ......... *G01R 15/181* (2013.01); *G01R 15/185* (2013.01); *G01R 15/247* (2013.01); *G01R 19/2506* (2013.01); *H01F 38/30* (2013.01)

(58) Field of Classification Search
CPC .................................................. G01R 15/181
See application file for complete search history.

(56) References Cited

U.S. PATENT DOCUMENTS

| | | |
|---|---|---|
| 7,545,138 B2 | 6/2009 | Wilkerson et al. |
| 7,902,812 B2 | 3/2011 | Kojovic |

(Continued)

FOREIGN PATENT DOCUMENTS

| | | |
|---|---|---|
| DE | 3544508 A1 | 6/1987 |
| EP | 2084721 A2 | 8/2009 |

(Continued)

OTHER PUBLICATIONS

German Search Report for German Application No. 10 2016 124 167.9, dated Sep. 1, 2017, with partial English translation—8 Pages.

(Continued)

*Primary Examiner* — Clayton E. LaBalle
*Assistant Examiner* — Jas A Sanghera
(74) *Attorney, Agent, or Firm* — RatnerPrestia

(57) ABSTRACT

A method and a sensor for measuring a time derivative of an AC current flowing through a measurement object are presented, wherein a Rogowski-Steinhaus-Chattock coil is aligned with the measurement object and at least one partitioning line is drawn into coil turns of the Rogowski-Steinhaus-Chattock coil and minimizes a capacitive coupling of the coil turns of the Rogowski-Steinhaus-Chattock coil among one another and/or to at least one further electrical line by virtue of the fact that an electrical potential corresponding to the electrical potential of the coil turns of the Rogowski-Steinhaus-Chattock coil is impressed on the at least one partitioning line by means of an active feedback.

18 Claims, 9 Drawing Sheets

(56) References Cited

U.S. PATENT DOCUMENTS

2013/0063129 A1 3/2013 Chamarti et al.
2015/0028853 A1* 1/2015 Pascal ................. G01R 15/181
  324/117 R

FOREIGN PATENT DOCUMENTS

WO 2010041139 A1 4/2010
WO 2015104189 A1 7/2015

OTHER PUBLICATIONS

Hewson et al., "The Effect of Electrostatic Screening of Rogowski Coils Designed for Wide-bandwidth Current Measurement in Power Electronics Applications", 2004 35th Annul IEEE Power Electronics Specialists Conference, Aachen, Germany—pp. 1143-1148.

* cited by examiner

ROGOWSKI CURRENT WITH ACTIVE CAPACITANCE COMPENSATION

CROSS-REFERENCE TO RELATED APPLICATIONS

This application claims priority to German Patent Application No. DE 10 2015 124 167.9, filed Dec. 13, 2016, which is incorporated by reference herein in its entirety.

FIELD OF THE INVENTION

The present invention relates to a method and a sensor for measuring an AC current in a current line by means of a Rogowski-Steinhaus-Chattock coil which is, equipped with an active capacitance compensation.

BACKGROUND OF THE INVENTION

Exact current measurements are of central importance in, electrical engineering. In this regard, e.g., current measurements in control loops generally directly determine a quality of a respective overall system. A so-called Rogowski-Steinhaus-Chattock coil can be used for measuring electrical AC current flowing m a measurement object, said coil allowing measurements with very high bandwidths.

A Rogowski-Steinhaus-Chattock current sensor consists of at least one Rogowski-Steinhaus-Chattock coil constructed from a toroidal conductor loop embodied in a circular fashion, in order to arrange the Rogowski-Steinhaus-Chattock coil perpendicularly around a conductor in a line system, the circle can have an opening. The return line of the toroidal conductor loop ending at the opening is usually led through the interior of the Rogowski-Steinhaus-Chattock coil. Rogowski-Steinhaus-Chattock coils constitute a simple and reliable method of ascertaining a current flow in an electrical line system. The current flow to be measured causes a magnetic field which surrounds the conductor and which induces a voltage in a Rogowski-Steinhaus-Chattock coil situated around the conductor. The current in the conductor can then be calculated from said voltage. Rogowski-Steinhaus-Chattock current sensors are used in a wide frequency range of AC currents. In this case, measurement disturbances become more and more significant toward higher frequencies.

As mentioned above, a Rogowski-Steinhaus-Chattock coil consists of a measuring line which is wound to form a toroid and which in general is wound as an outgoing conductor in the form of a helix spiral and after a turning point is led as a return conductor within the toroid back to a beginning of the toroid. The Rogowski-Steinhaus-Chattock coil (see A. P. Chattock (1887), "On a magnetic potentiometer", Proceedings of the Physical Society of London on 23-26, which is incorporated by reference herein; W. Rogowski and W. Steinhaus (1912), "Die Messung der magnetischen Spannung; Messung des Linienintegrals der magnetischen Feldstärke" ["Measuring the magnetic potential difference: measuring the line integral of the magnetic field strength", Archiv für Elektrotechnik, 1(4): 141-150), which is incorporated by reference herein, uses a toroidal coil to be placed around a measurement current or around a conductor carrying the measurement current. In a departure therefrom, the coil need not necessarily enclose the conductor (see S. Hain, M. Bakran (2014), "Highly dynamic current measurements with inductive current sensors—a numerical recipe", PCIM Europe, 1617-1624), which is incorporated by reference herein. In order to measure, by means of a Rogowski-Steinhaus-Chattock coil, a voltage signal that is proportional to the derivative of an electric current to be measured, the Rogowski-Steinhaus-Chattock coil should be wound very uniformly.

The Rogowski-Steinhaus-Chattock coil allows a measurement of AC currents with very high bandwidths from the millihertz range to the megahertz range. Using conventional Rogowski-Steinhaus-Chattock coils for current measurement, however, in the case of an AC current having a frequency of a few megahertz, limitations occur on account of physical properties of the Rogowski-Steinhaus-Chattock coil. It has been found that particular electrical capacitances occurring within a respective Rogowski-Steinhaus-Chattock coil and between the Rogowski-Steinhaus-Chattock coil and a measurement object or ground influence a measurement accuracy of a current measured by means of the Rogowski-Steinhaus-Chattock coil. In particular, four types of electrical capacitances which affect the measurement accuracy of a Rogowski-Steinhaus-Chattock coil can be identified here.

In this regard, an electrical capacitance between two arbitrary, in particular adjacent, turns of a Rogowski-Steinhaus-Chattock coil occurs in particular at a high frequency of an AC current passing through the Rogowski-Steinhaus-Chattock coil. This electrical capacitance has a greater effect, the higher a voltage difference between respective turns becomes, since a coupling between the capacitance and a voltage difference between the respective turns takes effect. Such a voltage difference increases with a frequency of a respective AC current passing through the coil as soon as, on account of short wavelength of the AC current, voltage differences already form between adjacent turns of the Rogowski-Steinhaus-Chattock coil. Furthermore, a voltage difference between respective turns of a Rogowski-Steinhaus-Chattock coil increases with a reduction of a spatial distance between respective turns. In order to increase a sensitivity of a respective Rogowski-Steinhaus-Chattock coil, however, the distance between respective turns of the Rogowski-Steinhaus-Chattock coil is often reduced or kept as small as possible and a number of turns is increased, or chosen to be as high as possible, such that an occurrence of capacitances between the turns in promoted in accordance with the explanations given above.

Analogously to the electrical capacitance between a respective turn of a Rogowski-Steinhaus-Chattock coil, an electrical capacitance between the respective turn and a return conductor led in the interior of a Rogowski-Steinhaus-Chattock coil can occur and be considered equivalently to the electrical capacitance between two arbitrary turns.

Furthermore, an electrical capacitance arises between each individual conductor part of a Rogowski-Steinhaus-Chattock coil and a respective measurement object or ground. In this case, an influence of a coupling between a respective conductor part of the Rogowski-Steinhaus-Chattock coil and the measurement object increases with a voltage and a frequency of an electric current flowing in the measurement object.

If an electrostatic shielding s present (see e.g. C. Hewson, W. F. Ray (2004), "The effect of electrostatic screening of Rogowski coils designed for wide-bandwidth current measurement in power electronic applications", Annual IEEE Power Electronics Specialists Conference, 35:1143-1148), which is incorporated by reference herein, a coupling between each individual conductor part of a Rogowski-Steinhaus-Chattock coil and a shielding potential is furthermore present.

In addition, all capacitances of a respective Rogowski-Steinhaus-Chattock coil together with a respective inductance form filters or resonances that can reduce a measurement bandwidth by orders of magnitude. Generally, an impedance across a capacitance decreases with increasing frequency of an AC current to be measured, for which reason signals and interference can undergo greater crosstalk in particular at high frequencies across capacitances.

What is important for the understanding and the function is to clearly differentiate between the voltage in a conductor, for example between the ends of the Rogowski-Steinhaus-Chattock coil which supply the measurement signal, and a reference potential of the conductor relative to ground. In this case, the voltage is defined merely as a difference and forms in particular as a result of the induction by the AC current to be measured. In this case, the voltage between two points of a conductor corresponds by definition to the difference between the potentials of the two points. However, the voltage, including the voltage induced by the current to be measured, does not define the potential of the corresponding conductor. However, this potential is of central importance for minimizing the capacitive coupling.

The document WO 2015 104 189 A1, which is incorporated by reference herein, describes a current measuring device that provides a Rogowski coil having two shields. In this case, the Rogowski coil is wound around a first shield, with a second shield surrounding the Rogowski coil. As a result of the shields, the measurement inaccuracies of the Rogowski coil are reduced and the bandwidth is increased.

The document WO 2010 041 139 A1, which is incorporated by reference herein, describes a coil for current measurement in electrical conductors, wherein the coil comprises at least one geometrically fully closed loop, that is to say is not embodied in a spiral fashion, in contrast to routine practice in the case of Rogowski coils. Adjacent loops here are electrically connected to one another.

Document EP 2 084 721 B1, which is incorporated by reference herein, describes a Rogowski coil arrangement comprising two Rogowski coils surrounded respectively by a magnetic shield, wherein a relay subtracts the voltage signals of the two coils from one another in order to minimize electrical disturbances.

Document DE 35 44 508 A1, which is incorporated by reference herein, describes a combined transducer for simultaneously measuring current and voltage on a conductor, wherein a Rogowski coil surrounded by a metallic, nonmagnetic shield is provided. In this case a capacitor is formed by the shield and the conductor to be measured, said capacitor being used for measuring the voltage in the conductor.

The document U.S. Pat. No. 7,545,138 B2, which is incorporated by reference herein, discloses a current measuring device in which a coil conductor is wound once completely around a coil core and is then wound completely in the opposite direction. In addition, the measuring current is surrounded by a Faraday shield.

SUMMARY OF THE INVENTION

Against this background, it is an object of the present invention to present a method and a sensor having the features of the independent patent claims, whereby the effect of the capacitances occurring is minimized.

Configurations of the invention can be gathered from the corresponding dependent claims and the description below.

The method according to aspects of the invention is configured for measuring a time derivative of an AC current flowing through a measurement object, wherein a Rogowski-Steinhaus-Chattock coil is aligned with the measurement object and at least one partitioning line is drawn into coil turns of the Rogowski-Steinhaus-Chattock coil and minimizes a capacitive coupling of the coil turns of the Rogowski-Steinhaus-Chattock coil among one another and/or to at least one further electrical line by virtue of the fact that an electrical potential corresponding to the electrical potential of the coil turns of the Rogowski-Steinhaus-Chattock coil is impressed on the at least one partitioning line by means of an active feedback of the potential at at least one point of the Rogowski-Steinhaus-Chattock coil to at least one point of the at least one partitioning line.

The active feedback is carried out by means of at least one feedback loop. The at least one feedback loop produces an electrical connection between at least one point of the at least one, partitioning line and at least one point of the Rogowski-Steinhaus-Chattock coil. For this purpose, the feedback loop actively impresses the potential of the Rogowski-Steinhaus-Chattock coil into the at least one partitioning line. A large portion of electric field lines that previously ended on the turns of the Rogowski-Steinhaus-Chattock coil now end on the at least one partitioning line, as a result of which a capacitive load of the Rogowski-Steinhaus-Chattock coil is reduced.

A feedback loop can consist of at least one electrical component from the following list: a voltage source, a filter, an amplifier, an offset, a resistor, lines having a high distributed resistance. The feedback loop can comprise e electrical components individually or else in combinations.

The interwoven partitioning line reduces the effective capacitive coupling consisting of the product of the capacitance and the voltage difference. The voltage difference can initially be reduced passively by virtue of the interwoven partitioning line following the line routine of the Rogowski-Steinhaus-Chattock coil as accurately as possible. A different line routing would lead to a different manifestation of the potential, which would reduce the effect of the partitioning line. A further passive measure consists in the equality of a termination impedance. A possible different length of a feed line to the Rogowski-Steinhaus-Chattock coil and a feed line to the at least one partitioning line should be taken into account here.

The method according to aspects of the invention proposes, in conjunction with or instead of passive measures or a selection thereof for reducing the effective capacitive coupling, carrying out an active feedback of the potential. Firstly a specific potential is established in the Rogowski-Steinhaus-Chattock coil, which can occur e.g. as a result of grounding or as a result of a different connection to a fixed potential. For optimally shielding the Rogowski-Steinhaus-Chattock coil, the at least one partitioning line should have at every location a potential which comes as close as possible to the potential of the geometrically closest point of the Rogowski-Steinhaus-Chattock coil. In a simplified manner of expression, the voltage between each point of the partitioning line and the closest point of the associated Rogowski-Steinhaus-Chattock coil should be almost zero. Accordingly, no appreciable electric field would arise between the Rogowski-Steinhaus. Chattock coil and the at least one partitioning line. At the same time, however, the electric field strength increases between individual turns of a partitioning line or between possible further partitioning lines. The energy for this state has to be actively provided. The charge reversal of the electric field between individual turns of a partitioning line or between possible further partitioning lines takes place with energy to be provided externally, but at the same time the Rogowski-Steinhaus-Chattock coil no longer need bring about charge reversal of a field and is correspondingly relieved of that burden. A feedback loop is used for this purpose, which feedback loop actively feeds in the potential of point of the Rogowski-Steinhaus-Chattock coil or a potential related to this potential at at least one point of each partitioning line electrically isolated from one another.

The feedback loop can have an amplifier as electrical component, which amplifier overall leads to a gain factor of less than 1 in order to prevent an oscillation of positive feedback and to guarantee stability.

Furthermore, the feedback loop can comprise a filtering. A feedback filter can be configured for example such that there is no or only little feedback far below the natural resonant frequency of the measured coil because the negative influence of the inherent capacitance appears negligible in this range. At the same time, however, a DC current component with a positive gain factor should furthermore be fed back because this produces a stable potential relationship. The feedback filter can furthermore effect downward regulation for example starting from the resonant frequency of a capacitance-compensating structure in order to prevent the resonance from being amplified.

Furthermore, the feedback loop can contain an offset as electrical component, which offset is adjustable by the user or was calibrated by the manufacturer.

A potential feed-in by active feedback can be carried out at a plurality of points. In this case, a partitioning line is not directly reliant on the induced voltage to sufficiently establish the potential difference with respect to the closest point on the Rogowski-Steinhaus-Chattock coil over the entire length. This results in a flexibility for properties of the partitioning line, for example with regard to shape, cross section, conductor geometry, conductor material, impedance, etc.

A similar situation applies to a coaxial partitioning line having a distinctly different geometry and thus induced voltages. A feed-in is advantageous near the points at which the respective partitioning line reaches the vicinity of the Rogowski-Steinhaus-Chattock coil for the first and last time, that is to say e.g. on the outgoing conductor before the beginning of the toroidal conductor loop and on the return conductor when it emerges at the end from the toroidal conductor loop. In this case, a termination impedance can both reduce the energy of the induced voltage, in order to attenuate it relative to the voltage fed back, and set the frequency response.

Preferably, in the case of a feedback on both, sides, wherein a point of the outgoing conductor before the beginning of the toroidal conductor loop represents one side and a point of the return conductor when it emerges at the end from the toroidal conductor leap represents the other side, at least one side comprises a finite output resistance in order to prevent an appreciable current flow from one feedback side to the other feedback side via a partitioning line. Preferably, however, with the use of an output resistance, the feedback will take place across such an output resistance, such that although the output resistance limits the current, nevertheless the potential downstream of the output resistance is regulated and the voltage drop across the latter is thus compensated for.

Instead of or in addition to current limiting in a partitioning line by one or a plurality of output resistances, a conductor material having a high distributed resistance can moreover be used. By means of a distributed high resistance, the potential distribution of the partitioning line from the respective points at which a potential feed-in is performed can be set very accurately, without either having to cause a high current flow or having to combat the voltage induced by the current to be measured.

For minimizing the capacitance from turn to turn, the interweaving of at least two partitioning lines is particularly advantageous. In the case of exactly two partitioning lines, it is advantageous if they are interwoven into the Rogowski-Steinhaus-Chattock coil such that a turn of the Rogowski-Steinhaus-Chattock coil is partitioned from its own closest turn on one side by one partitioning line and on the other side by the other partitioning line. Each of the partitioning lines is referenced with regard to its potential relative to the Rogowski-Steinhaus-Chattock coil, which can be effected e.g. via a voltage source.

Furthermore, for carrying out the method according to aspects of the invention a sensor is claimed which comprises a Rogowski-Steinhaus-Chattock coil and wherein at least one partitioning line is drawn into coil turns of the Rogowski-Steinhaus-Chattock coil, an electrical potential which corresponds to the electrical potential of the coil turns of the Rogowski-Steinhaus-Chattock coil being impressed on said at least one partitioning line by means of an active feedback.

In accordance with one possible embodiment, the sensor comprises a volt source for the active feedback of the electrical potential.

As an alternative or in addition thereto, the sensor can also comprise a filter. In a further embodiment, the sensor can also comprise an amplifier element for the active feedback of the electrical potential.

Furthermore, the sensor can also have a calibratable offset.

Furthermore, the sensor can have a partitioning line at which an active feedback of the electrical potential takes place at a plurality of locations.

In addition, the sensor can comprise components having a finite output resistance at at least one of the locations of the partitioning line which are used for the active feedback of the electrical potential.

Furthermore, the sensor can comprise, to at least one location of the partitioning line, a feed line consisting of a conductor material having a high distributed resistance.

In accordance with a further embodiment, the sensor comprises at least two partitioning lines which are situated between the coil turns of the Rogowski-Steinhaus-Chattock wherein they are each by themselves referenced to a potential.

BRIEF DESCRIPTION OF THE DRAWINGS

Further advantages and configurations of the invention are evident from the description and the accompanying drawings.

It goes without saying that the features mentioned above and those yet to be explained below can be used not only in the combination respectively indicated, but also in other combinations or by themselves, without departing from the scope of the present invention.

FIG. 1 shows in schematic illustration one embodiment of a sensor according to aspects of the invention comprising a coil provided according to aspects of the invention, which is also called Rogowski-Steinhaus-Chattock coil in the context of the present description, and wherein a partitioning line was drawn in.

DETAILED DESCRIPTION OF THE INVENTION

Figure 1:
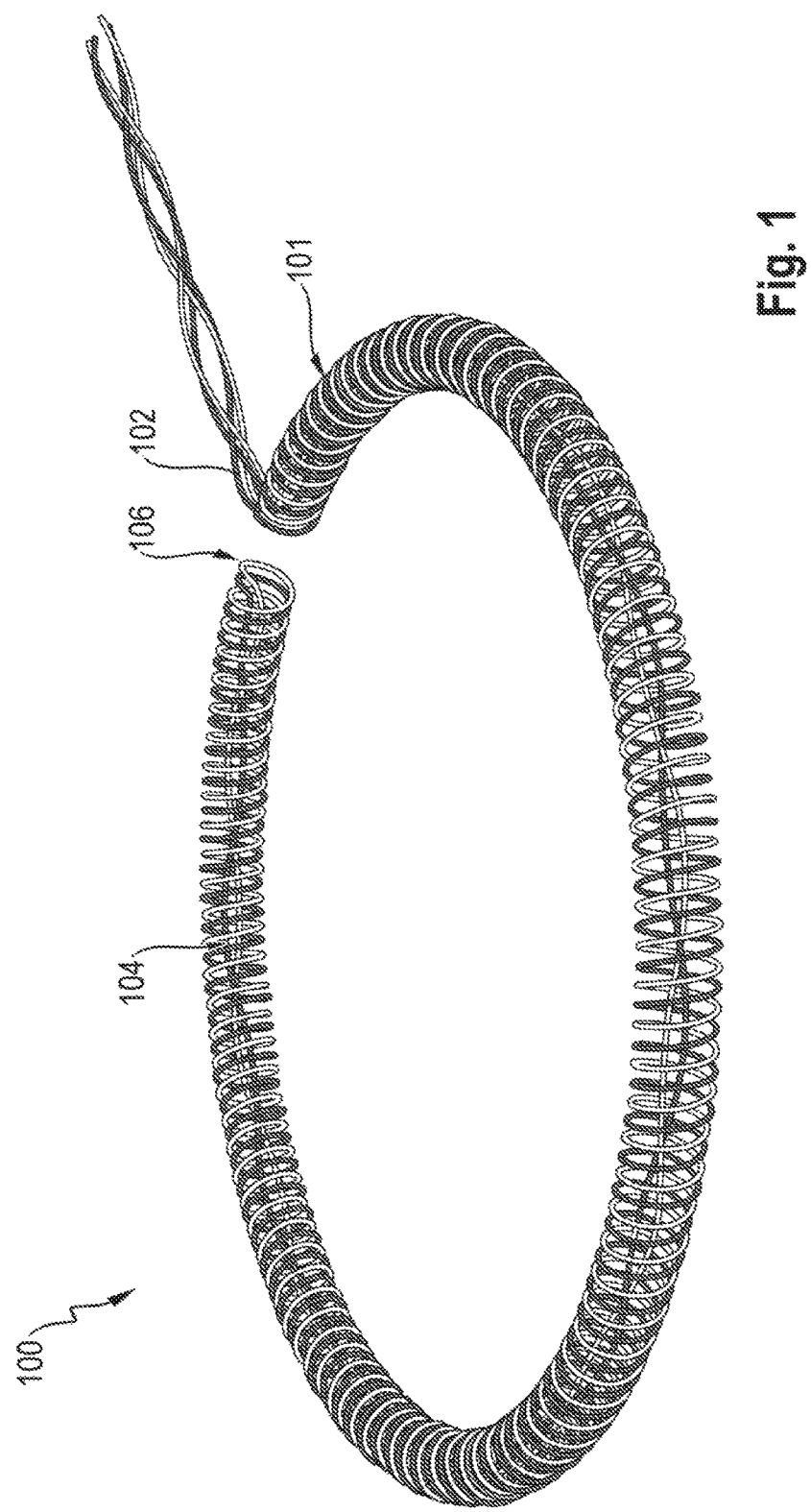

FIG. 1 shows a measuring coil 100 of a Rogowski-Steinhaus-Chattock sensor, said measuring coil comprising a Rogowski-Steinhaus-Chattock coil 101 embodied as part of a measuring line 102, according to aspects of the invention a partitioning line 106 having been interwoven into said Rogowski-Steinhaus-Chattock coil 101. In the embodiment shown, the partitioning line 106 takes to the greatest possible extent the same geometric course as the closest point of the accompanying laid measuring line 102 of the Rogowski-Steinhaus-Chattock coil 101. What can be achieved by a suitable interconnection of the partitioning line 106 within the Rogowski-Steinhaus-Chattock sensor is that the partitioning line has a potential profile as far as possible identical to that of the Rogowski-Steinhaus-Chattock coil 101. Possible realizations of said interconnection are shown in further figures. An electrical conductor with which the measuring line 102 or each individual conductor part of the measuring line 102 can form a voltage difference $\Delta V$, or has a capacitance C, may be in this case an arbitrary turn of the Rogowski-Steinhaus-Chattock coil 101 itself, an internal return conductor 104, a measurement object through which current flows, or ground (ground potential), or else a shield possibly present. Although the partitioning line 106 leaves said capacitances C unchanged, a greatest possible potential equality of Rogowski-Steinhaus-Chattock coil 101 and of the interwoven partitioning line 106, said potential equality being achieved with a suitable interconnection, allows a large portion of the electric field lines to end on the partitioning line 106 and thus reduces the voltage difference $\Delta V$ and thus the effective coupling $C\Delta V$ that disturbs the measuring process taking place through the Rogowski-Steinhaus-Chattock coil 101.

Figure 2:
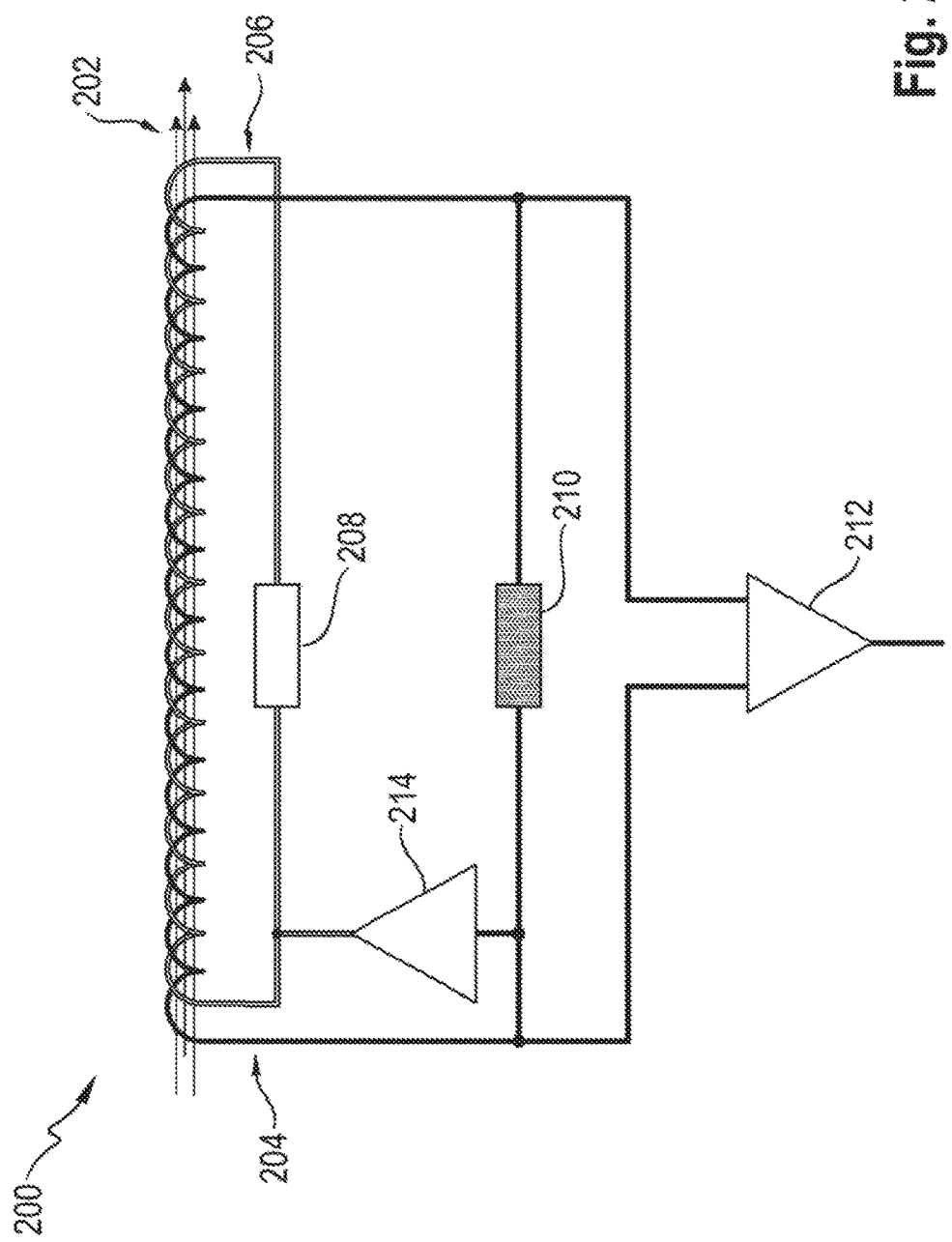
FIG. 2 shows in schematic illustration a possible circuit diagram for the interconnection according to aspects of the invention of a partitioning line within one embodiment of the Rogowski-Steinhaus-Chattock sensor according to aspects of the invention.

FIG. 2 shows in schematic illustration a possible circuit diagram for the interconnection according to aspects of the invention of a partitioning line 236 within one embodiment of the Rogowski-Steinhaus-Chattock sensor 200 according to aspects of the invention. As shown in FIG. 1, the partitioning line 206 is interwoven into a Rogowski-Steinhaus-Chattock coil 204, such that the same magnetic flux 202 is applied to both. Since voltage conditions that are as similar as possible are intended to prevail in the Rogowski-Steinhaus-Chattock coil 204 and the partitioning line 206, the respective ends can be terminated electrically similarly or identically. In the case of the Rogowski-Steinhaus-Chattock coil 204, the electrical termination can consist for example of an impedance 210, which can constitute an amplifier input impedance or alternatively a line termination (for instance for preventing reflections). In order to achieve voltage conditions that are as similar as possible in the Rogowski-Steinhaus-Chattock coil 204 and the partitioning line 206, in the simplest case the partitioning line 206 can thus be terminated with a termination impedance of the same magnitude as the impedance 210.

Furthermore, the termination of the partitioning line 206 by means of the termination impedance 208 can be used to compensate for manufacturing-, construction-dictated car else design-dictated differences in Rogowski-Steinhaus-Chattock coil 204 and partitioning line 206 which may bring about for example a slight over- or undercompensation of the measurement disturbances.

Furthermore, the termination of the partitioning line 206 can already be effected near the Rogowski-Steinhaus-Chattock coil 204, such that the partitioning line 206 need not have an identical feed line course having a length of a plurality of meters, for example, between the Rogowski-Steinhaus-Chattock coil 204 and the amplifier 212. In this case, however, the lacking impedance in comparison with the feed line course must be compensated for by the choice of the termination impedance 208.

Over and above an identical termination impedance, according to aspects of the invention the voltage difference between the Rogowski-Steinhaus-Chattock coil 204 and the closest point on the partitioning line 206 is minimized by an active feedback. This means that besides the same voltage achieved by the interweaving per conductor length or conductor location and hence the same increase in potential, the potential of at leas one point of the partitioning line 206 is also referenced to at least one potential of a point of the Rogowski-Steinhaus-Chattock coil 204. This referencing is effected by an active feedback of the potential at the point of the partitioning line 206 with the potential of the point at the Rogowski-Steinhaus-Chattock coil 204, which corresponds to the setting of the voltage between these two points, and is represented by an electrical component 214 in FIG. 2. One simple realization of the electrical component 214 would be provided by a voltage source.

Figure 3:
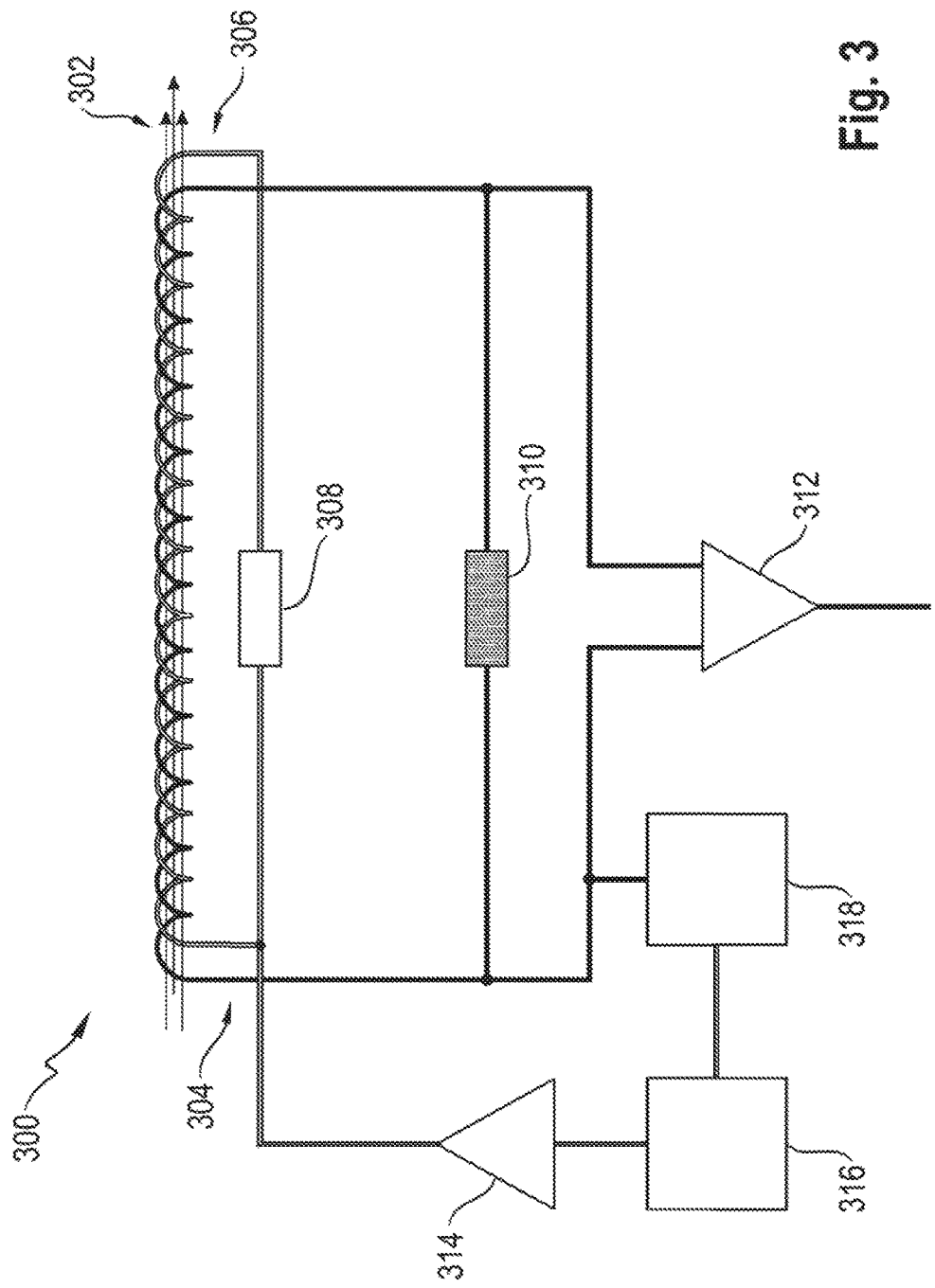
FIG. 3 shows in schematic illustration a possible circuit diagram in which an active feedback is implemented on one side.

FIG. 3 shows in schematic illustration a possible circuit diagram or the interconnection according to aspects of the invention of a partitioning line 306 within one embodiment of a Rogowski-Steinhaus-Chattock sensor 300 according to aspects of the invention comprising a Rogowski-Steinhaus-Chattock coil 304. The same magnetic flux 302 is applied to the partitioning line 306 and the Rogowski-Steinhaus-Chattock coil 304. The Rogowski-Steinhaus-Chattock coil 304 is provided with a termination impedance 310 and its measurement signal is conducted to an amplifier 312. The active feedback is represented by a voltage source 314, a filter 316 for correcting the frequency response and an adjustable amplifier 318. In this case, the gain is preferably chosen such that a total gain of less than 1 results, wherein all further filter properties and also physical properties of all components which can influence the gain should be taken into account. An active feedback could also be realized if the filter 316 or the adjustable amplifier 318 were regarded as optional in this circuit diagram. Finally, the termination impedance 308 of the partitioning line 305 can also be regarded as optional here.

Figure 4:
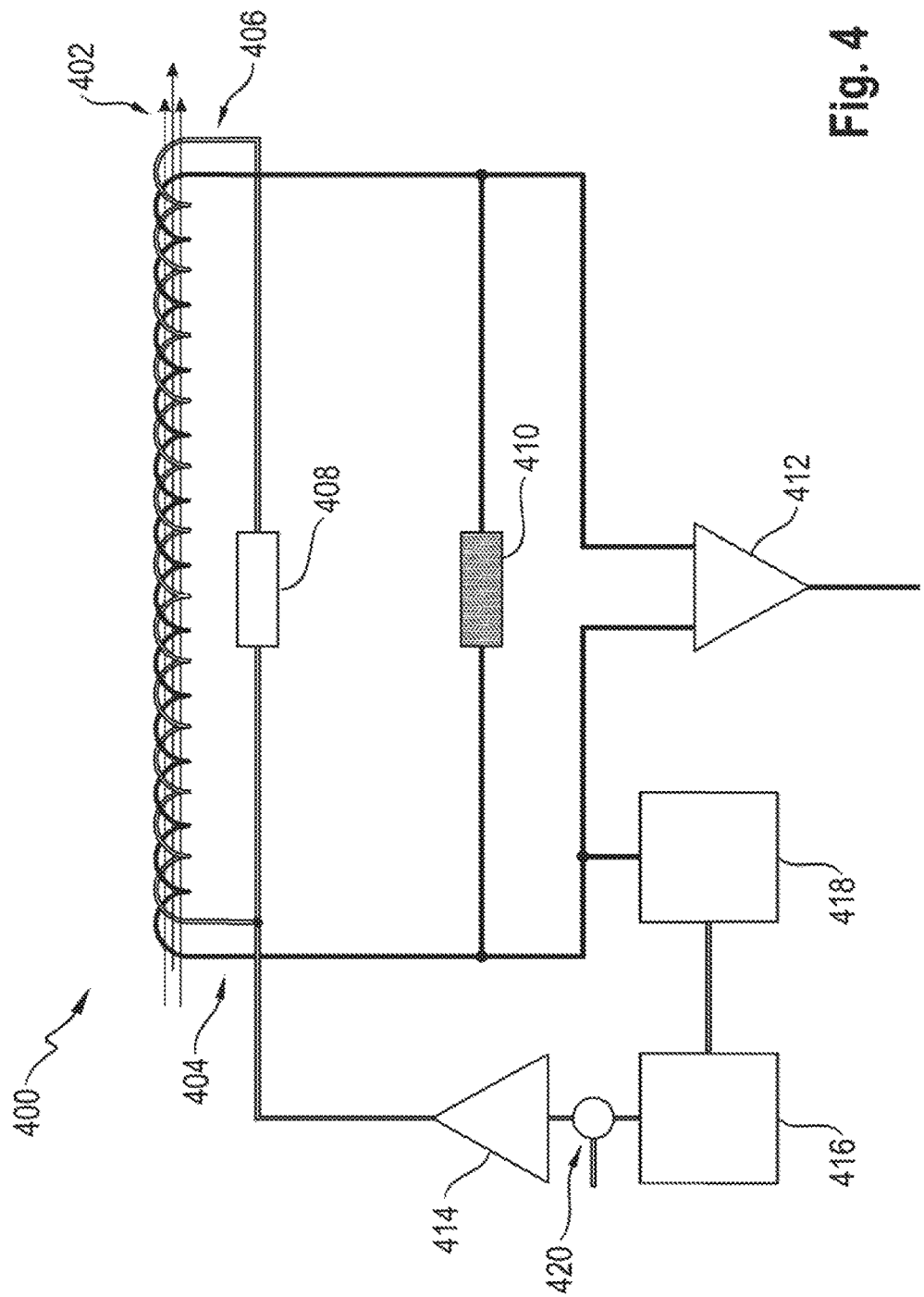
FIG. 4 shows in schematic illustration a possible circuit diagram in which an offset can be set.

FIG. 4 shows in schematic illustration a possible circuit diagram for the interconnection according to aspects of the invention of a partitioning line 406 within one embodiment of a Rogowski-Steinhaus-Chattock sensor 400 according to aspects of the invention comprising a Rogowski-Steinhaus-Chattock coil 404. The same magnetic flux 402 is applied to the partitioning line 406 and the Rogowski-Steinhaus-Chattock coil 404. The Rogowski-Steinhaus-Chattock coil 404 is provided with a termination impedance 410 and its measurement signal is conducted to an amplifier 412. The active feedback comprises a voltage source 414, a fitter 416 and an amplifier 418. Furthermore, an offset 420 is inserted as electrical component. The offset 420 can be adjustable by the user or can be calibrated by the manufacturer. The termination impedances 408 and 410 can optionally be omitted.

Figure 5:
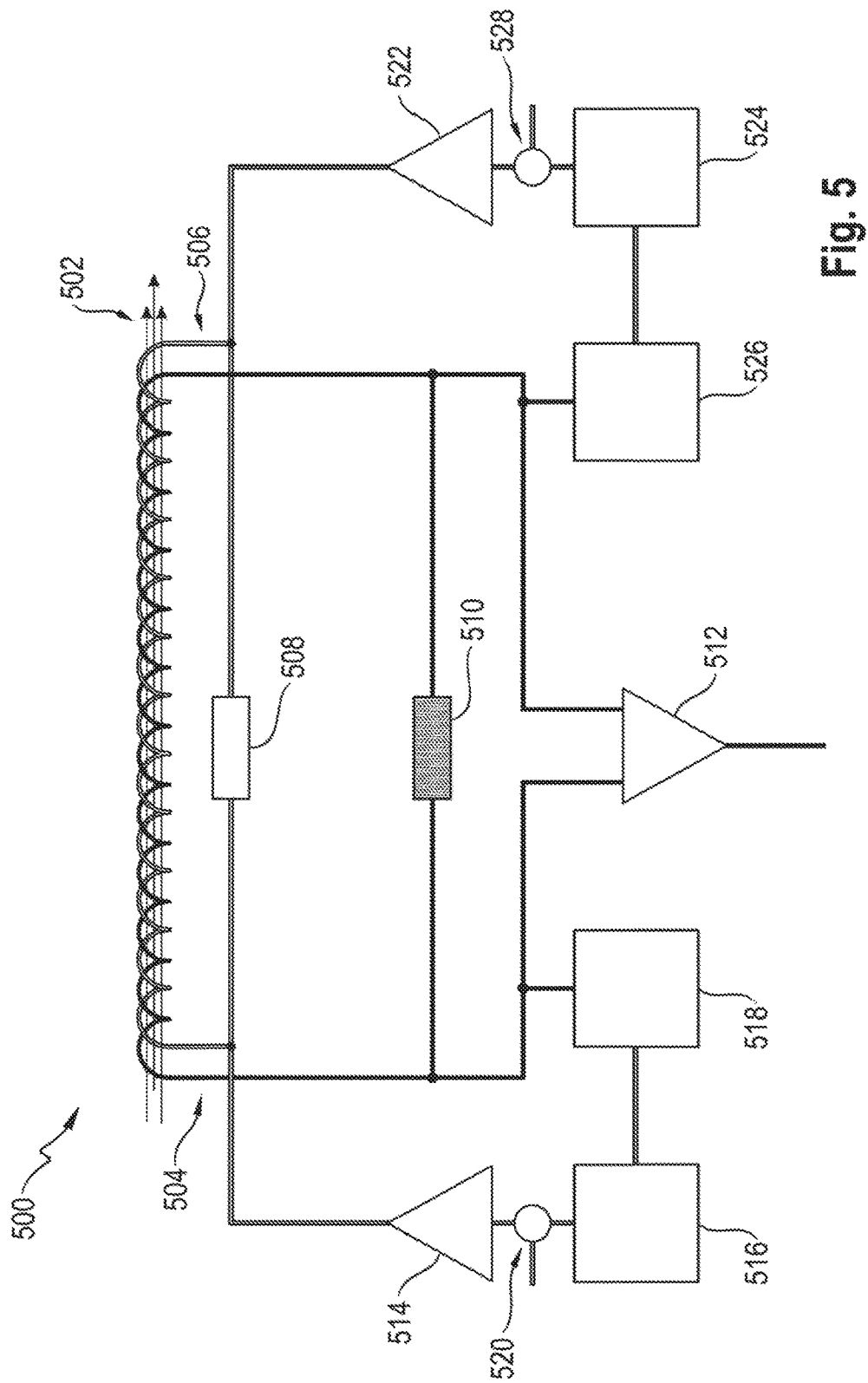
FIG. 5 shows in schematic illustration a possible circuit diagram in which an active feedback can be implemented on both sides.

FIG. 5 shows in schematic illustration a possible circuit diagram for the interconnection according to aspects of the invention of a partitioning line 506 within one embodiment of a Rogowski-Steinhaus-Chattock sensor 500 according to aspects of the invention, wherein the active feedback is effected on both sides, i.e. at the respective beginning and end of a Rogowski-Steinhaus-Chattock coil 504. The same magnetic flux 502 is applied to the partitioning line 506 and the Rogowski-Steinhaus-Chattock coil 504. The Rogowski-Steinhaus-Chattock coil 504 is provided with a termination impedance 510 and its measurement signal is conducted to an amplifier 512. The electrical components of the active feedback comprise on both sides a voltage source 514 and 522, respectively, an offset 520 and 528, respectively, a filter 516 and 524, respectively, and n amplifier 518 and 526, respectively. The termination impedances 508 and 510 can optionally be omitted.

As described above, potential can be impressed by active feedback at a plurality of points. In this case, a partitioning line 506 is not directly reliant on the induced voltage to sufficiently establish the potential difference with respect to the closest point on the Rogowski-Steinhaus-Chattock coil 504 over the entire length. Consequently, this solution gains significantly further flexibility for the partitioning line, for example with regard to shape, cross section, conductor geometry, conductor material, impedance, etc. A similar situation applies to a coaxial partitioning line having a distinctly different geometry and thus different induced voltages. In this case, a termination impedance 508 can both reduce the energy of the induced voltage, in order to attenuate it relative to the voltage fed back, and set the frequency response.

Figure 6:
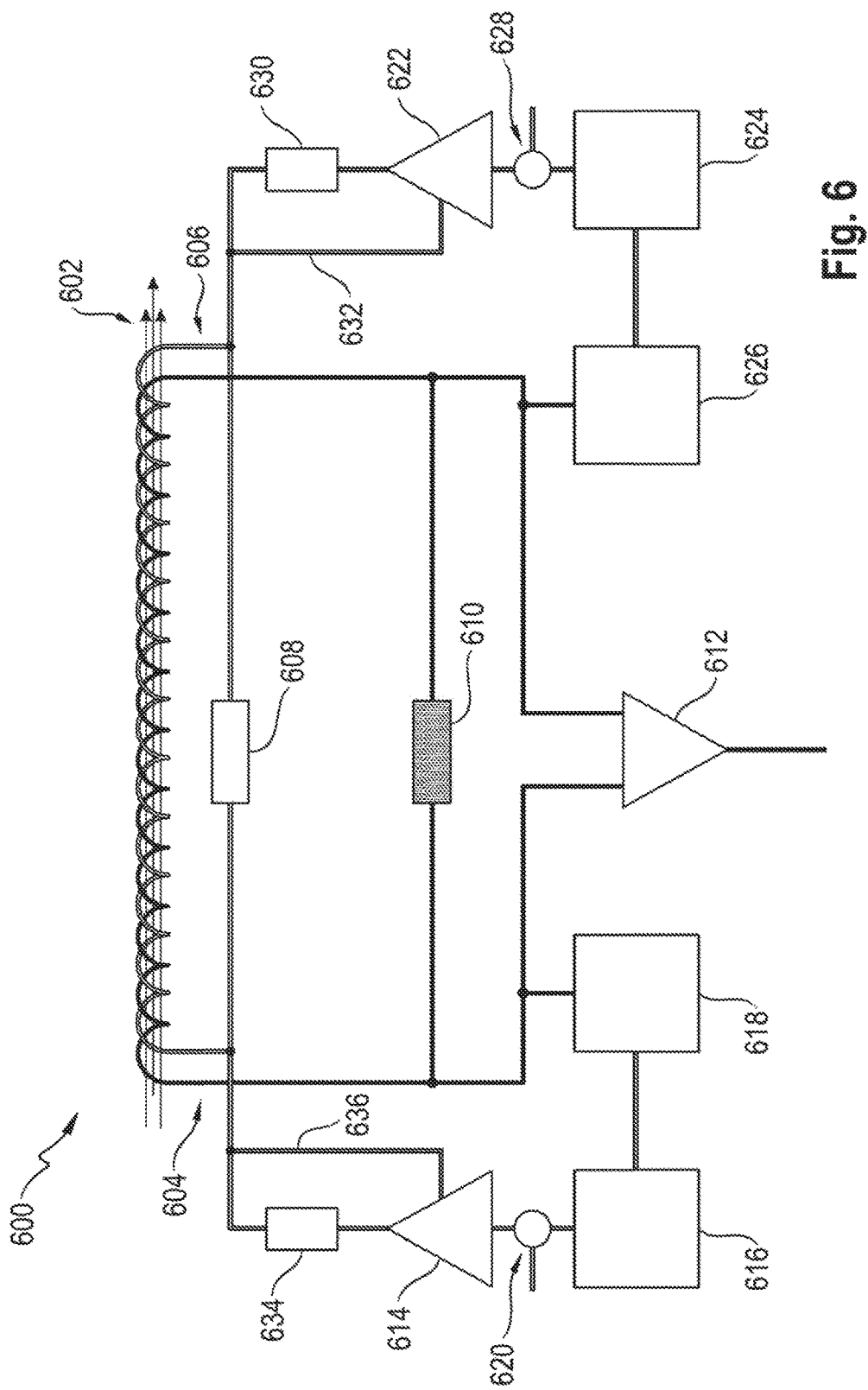
FIG. 6 shows in schematic illustration a possible circuit diagram in which an active feedback additionally has a terminating resistance.

FIG. 6 shows in schematic illustration a possible circuit diagram for the interconnection according to aspects of the invention of a partitioning line 506 within one embodiment of a Rogowski-Steinhaus-Chattock sensor 600 according to aspects of the invention comprising a Rogowski-Steinhaus-Chattock coil 604, wherein the active feedback is effected on both sides. The same magnetic flux 602 is applied to the partitioning line 606 and the Rogowski-Steinhaus-Chattock coil 604. The Rogowski-Steinhaus-Chattock coil 604 is provided with a termination impedance 610 and its measurement signal is conducted to an amplifier 612. The electrical components of the active feedback comprise on both sides a voltage source 614 and 622, respectively, an offset 620 and 628, respectively, a filter 616 and 624, respectively, and an amplifier 618 and 626, respectively. The termination impedances 608 and 610 can optionally be omitted. Furthermore, both sides of the active feedback comprise a finite output resistance 634 and 630, respectively, in order to prevent an appreciable current flew from one feedback to the other via a partitioning line.

Preferably, however, with the use of an output resistance, the feedback will take place across such an output resistance, represented by lines 636 and 632, respectively, such that although the output, resistance limits the current, nevertheless the potential downstream of the output resistance is regulated and thus the voltage drop across the latter is compensated for.

Figure 7:
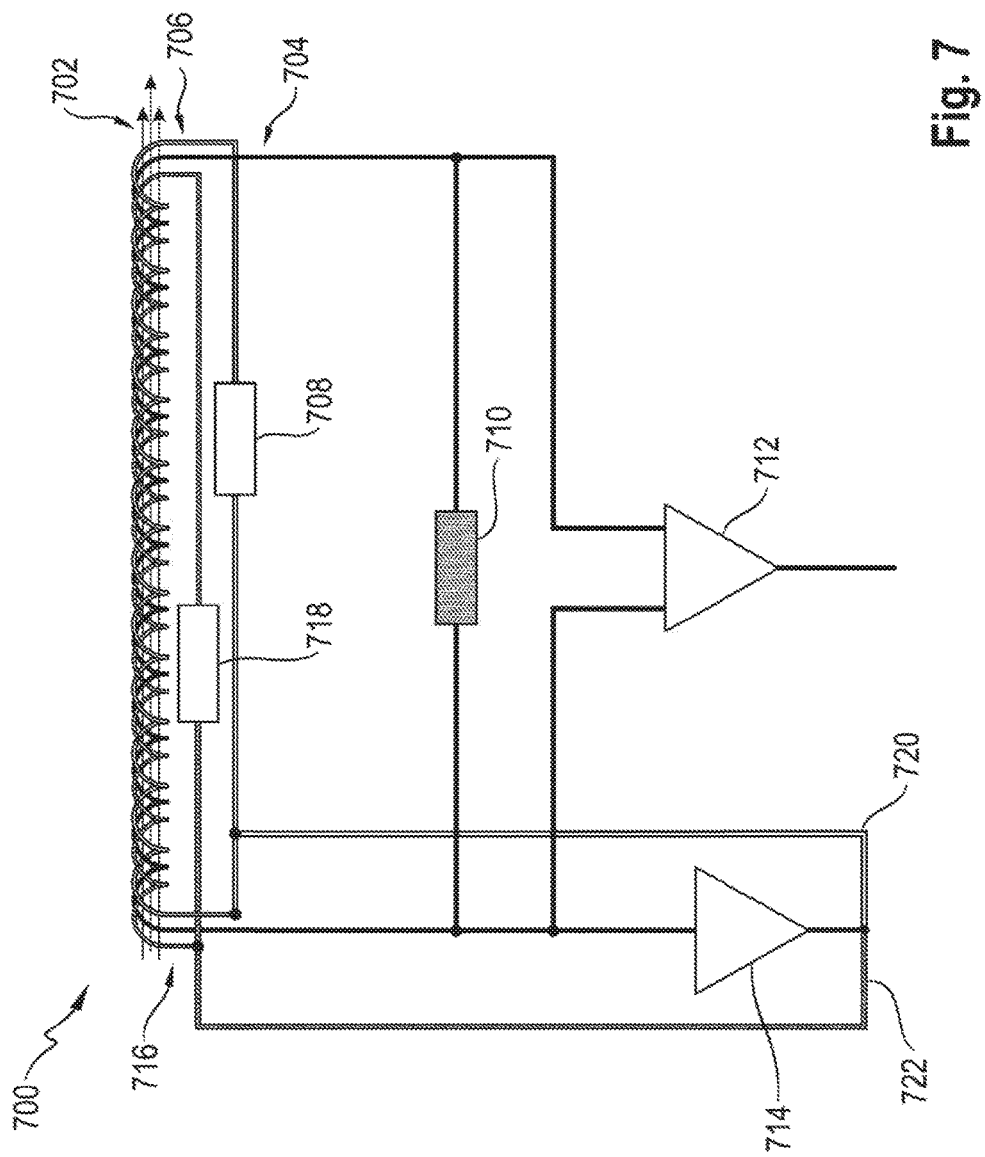
FIG. 7 shows schematic illustration a possible circuit diagram for the interconnection according to aspects of the invention of two partitioning lines within one embodiment of the Rogowski-Steinhaus-Chattock sensor according to aspects of the invention.

FIG. 7 shows in schematic illustration a possible circuit diagram for the interconnection according to aspects of the invention of a first partitioning line 706 and a second partitioning line 716 within one embodiment of a Rogowski-Steinhaus-Chattock sensor 700 according to aspects of the invention. Both partitioning lines 706 and 716 have been interwoven into a Rogowski-Steinhaus-Chattock coil 704. For minimizing the capacitance from turn to turn, the interweaving of two partitioning lines is particularly advantageous if they are interwoven into the Rogowski-Steinhaus-Chattock coil 704 such that a turn of the Rogowski-Steinhaus-Chattock coil 704 is partitioned from its own closest turn on one side by one partitioning line and on the other side by the other partitioning line. Both partitioning lines 706 and 716 and the Rogowski-Steinhaus-Chattock coil 704 experience the same magnetic flux 702. Each of the partitioning lines is referenced with regard to its potential relative to the Rogowski-Steinhaus-Chattock coil 704, for example via a voltage source 714 connected to the two partitioning lines 706 and 716 by means of the feed lines 720 and 722. Moreover, both, partitioning lines 706 and 708 can be provided with a respective termination impedance 708 and 718. The Rogowski-Steinhaus-Chattock coil 704 is provided with a termination impedance 710 and its measurement signal is conducted to an amplifier 712.

Figure 8:
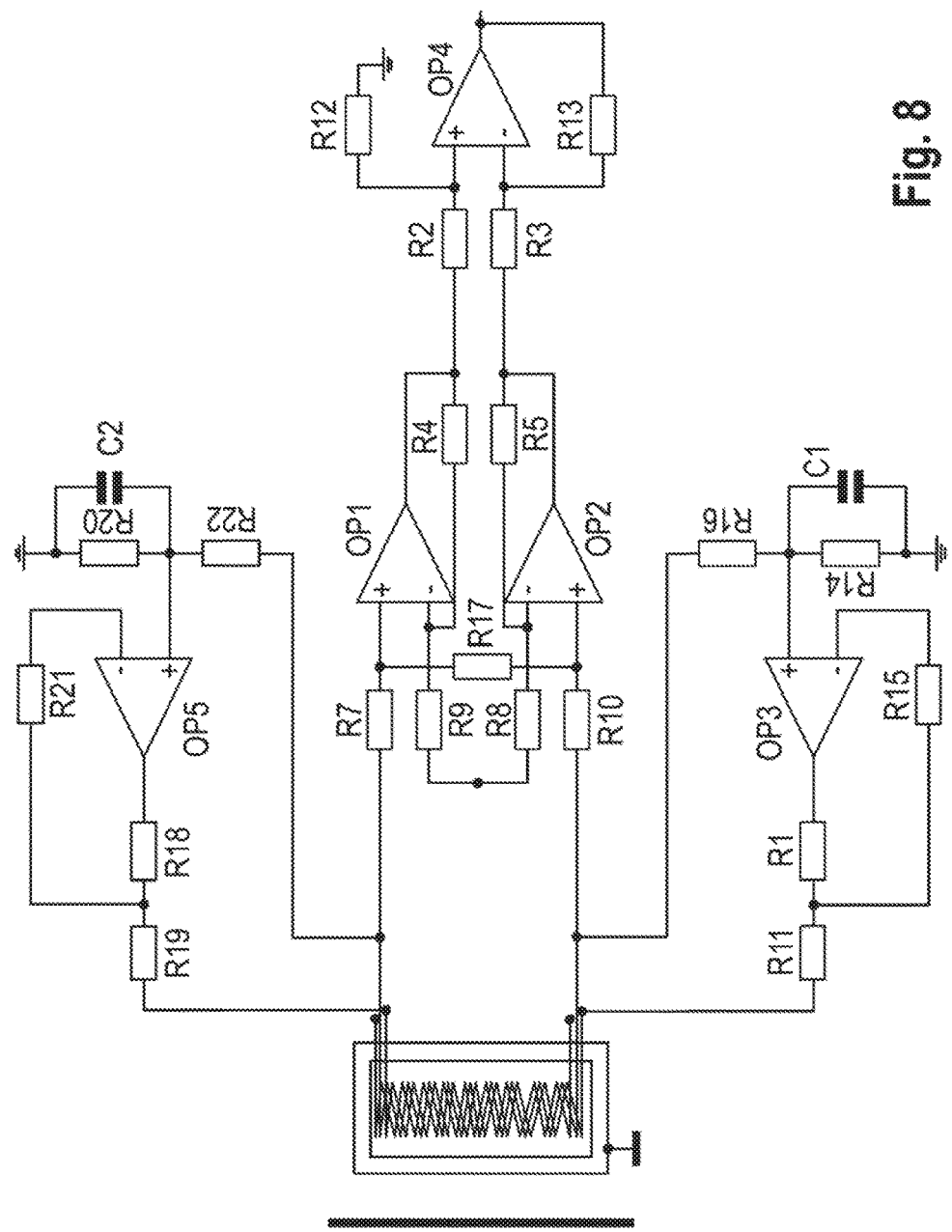
FIG. 8 shows in schematic illustration a possible circuit diagram for the interconnection according to aspects of the invention of two partitioning lines for which an active feedback per partitioning line is carried out only at one location.

FIG. 8 shows in schematic illustration a possible circuit diagram for the interconnection according to aspects of the invention of two partitioning lines for which an active feedback per partitioning line is carried out only at one location.

Figure 9:
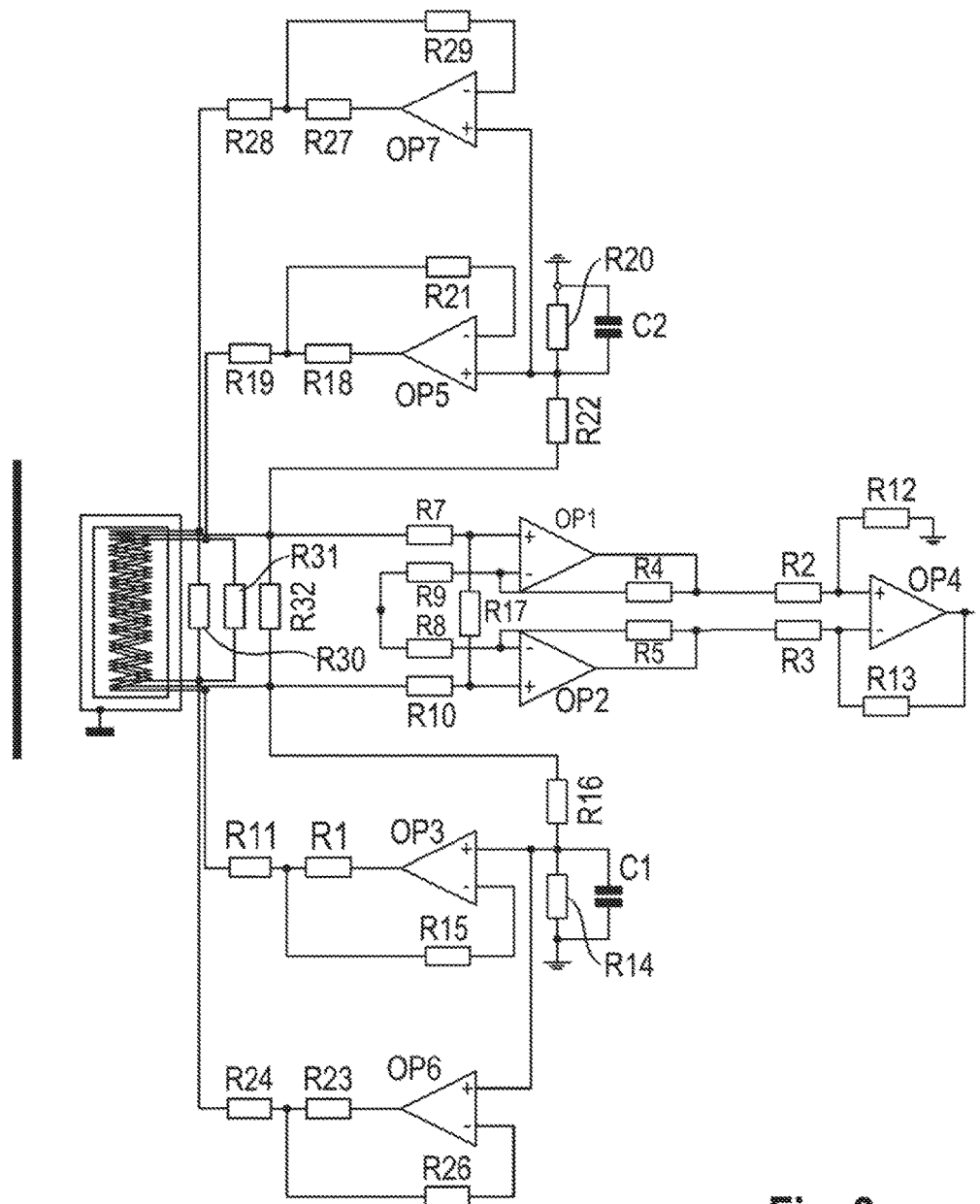
FIG. 9 shows in schematic illustration a possible circuit diagram for the interconnection according to aspects of the invention of two partitioning lines for which an active feedback per partitioning line is carried out on both sides.

FIG. 9 shows ire schematic illustration a possible circuit diagram for the interconnection according to aspects of the invention of two partitioning lines for which an active feedback per partitioning line is carried out on both sides.

What is claimed is:

1. A method for measuring a time derivative of an AC current flowing through a measurement object, wherein a Rogowski-Steinhaus-Chattock coil is aligned with the measurement object and at least one partitioning line is drawn into coil turns of the Rogowski-Steinhaus-Chattock coil, the method comprising:

impressing with an active feedback an electrical potential corresponding to an electrical potential of the coil turns of the Rogowski-Steinhaus-Chattock coil to minimize capacitive coupling of the coil turns of the Rogowski-Steinhaus-Chattock coil at least one of among one another or to at least one further electrical line.

2. The method as claimed in claim 1, wherein the active feedback comprises at least one voltage source.

3. The method as claimed in claim 1, wherein the active feedback comprising at least one filter is used for the active feedback.

4. The method as claimed in claim 1, wherein the active feedback comprises at least one amplifier.

5. The method as claimed in claim 1, wherein the active feedback comprises at least one calibratable offset.

6. The method as claimed in claim 1, wherein the active feedback is impressed as an electrical potential at a plurality of locations of the partitioning line.

7. The method as claimed in claim 6, wherein at, at least one location respective components for the active feedback have a finite output resistance.

8. The method as claimed in claim 1, wherein a conductor material having a distributed resistance is used for a feed line to at least one location of the partitioning line.

9. The method as claimed in claim 1, wherein at least two partitioning lines are situated between the coil turns of the Rogowski-Steinhaus-Chattock coil, and they are each by themselves referenced to a potential.

10. A sensor for carrying out the method as claimed in claim 1, the sensor comprising:
   the Rogowski-Steinhaus-Chattock coil having coil turns;
   the at least one partitioning line is drawn into the coil turns of the Rogowski-Steinhaus-Chattock coil; and
   the active feedback configured to impress the electrical potential corresponding to the electrical potential of the coil turns of the Rogowski-Steinhaus-Chattock coil on said at least one partitioning line.

11. The sensor as claimed in claim 10, wherein the active feedback comprises at least one voltage source for impressing the electrical potential.

12. The sensor as claimed in claim 10, wherein the active feedback comprises at least one filter for impressing the electrical potential.

13. The sensor as claimed in claim 10, which comprise at least one amplifier element for the active feedback impressing the electrical potential.

14. The sensor as claimed in claim 10, wherein the active feedback comprise at least one calibratable offset impressing the electrical potential.

15. The sensor as claimed in claim 10, which utilizes a plurality of locations of the partitioning line for the active feedback of the electrical potential.

16. The sensor as claimed in claim 15, further comprising:
   components having a finite output resistance at at least one location which is used for the active feedback of the electrical potential.

17. The sensor as claimed in claim 10, further comprising:
   a feed line including a conductor material having a distributed resistance to at least one location of the partitioning line.

18. The sensor as claimed in claim 10, which comprises at least two partitioning lines positioned between the coil turns of the Rogowski-Steinhaus-Chattock coil, and which are each by themselves referenced to a potential.

* * * * *